United States Patent
Wen

[19]
[11] Patent Number: 5,804,484
[45] Date of Patent: Sep. 8, 1998

[54] METHOD OF FABRICATING MULTI-STAGE READ-ONLY MEMORY SEMICONDUCTOR STRUCTURAL CONFIGURATION

[75] Inventor: Jemmy Wen, Hsinchu, Taiwan

[73] Assignee: United Microelectronics Corp., Taiwan

[21] Appl. No.: 768,888

[22] Filed: Dec. 17, 1996

[30] Foreign Application Priority Data

Oct. 2, 1996 [TW] Taiwan .................................. 85112050

[51] Int. Cl.$^6$ .............................................. H01L 21/8246
[52] U.S. Cl. ............................................ 438/278; 438/130
[58] Field of Search .................................. 438/130, 275, 438/276, 277, 278

[56] References Cited

U.S. PATENT DOCUMENTS

| | | | |
|---|---|---|---|
| 4,104,784 | 8/1978 | Klein ........................................ | 438/276 |
| 4,315,781 | 2/1982 | Henderson ................................ | 438/276 |
| 4,608,748 | 9/1986 | Noguchi et al. ......................... | 438/278 |
| 5,275,959 | 1/1994 | Kobayashi et al. ..................... | 438/278 |

*Primary Examiner*—Chandra Chaudhari
*Attorney, Agent, or Firm*—Cushman Darby & Cushman IP Group of Pillsbury Madison & Sutro LLP

[57] ABSTRACT

A process for fabricating multi-stage memory cell units o semiconductor ROM device is disclosed. Each of the ROM device multi-stage memory cell units holds data bits that can be interpreted into any one of a number of voltage or current levels of more than two. The process is consisted of the steps of first forming a MOS transistor in the device substrate, and the transistor comprises a pair of source/drain regions and a gate structure. An insulating layer is then formed covering the transistor. A contact opening is then formed in each of the pair of source/drain regions. A resistor connecting across the source/drain regions of the transistor is then formed, and the resistor has each of its ends extending into corresponding one of the contact openings. Then, the memory cell unit is programmed at a first stage by optionally cutting or not cutting the resistor into electrically disconnected halves. In the second stage of programming, impurity ions are optionally implanted into the channel region underneath the transistor gate structure with or without the presence of a masking layer covering the channel region. Combinations of different resistance values in the source/drain resistor and different transistor channel region threshold voltages obtained in the first and second programming stages therefore comprise the multi-stage memory cell transistor threshold voltages for the ROM device.

6 Claims, 12 Drawing Sheets

METHOD OF FABRICATING MULTI-STAGE READ-ONLY MEMORY SEMICONDUCTOR STRUCTURAL CONFIGURATION

BACKGROUND OF THE INVENTION

1. Field of the Invention

This invention relates in general to a multi-stage read-only memory (ROM) semiconductor structural configuration and the method of its fabrication. In particular, the invention relates to a process for fabricating a multi-stage ROM structure and the method of its fabrication suitable for use in multi-stage memory cell units for implementing multistage logical numbering systems greater than the two levels for the conventional binary numbering system.

2. Technical Background

ROM is a category of semiconductor memory devices that is widely used in digital electronic systems. For example, microprocessor-based computer systems or minicomputer systems utilize ROM devices for the storage of system level program information that are not frequently changed. An example of such application is the use of ROM devices for the storage of the basic input/output system (BIOS) code for microprocessor-based personal computer systems. BIOS is the system level control program that is responsible for controlling the operation of I/O peripherals of the computer system. A typical characteristic of the BIOS code is that it is designed to reside in nonvolatile memory devices such as ROM so as to bring up the computer system after system power is applied.

ROM devices are relatively complicate to fabricate considering the variety of memory storage contents they are required to hold. Fabrication of conventional ROM devices involves time-consuming procedural steps as well as sophisticated material handling operations when compared to other categories of semiconductor memory devices. Essentially, ROM devices are normally fabricated in the semiconductor fabrication facility with the memory content provided by the customer programmed in-process in the procedure known as mask programming.

In general, all ROM devices of the same type or model from a manufacturer can be considered structurally the same except that the memory contents thereof are different. In other words, before the memory contents are mask-programmed, ROM devices of the same type or model are physically the same. For substantially all ROM manufacturers, ROM devices are therefore manufactured into a "half product" to the stage just before being mask-programmed. These half-product ROM memory devices thus can be stocked for immediate mask-programming in the subsequent fabrication process when desired. This ensures a fast delivery of ROM products after customers issue order.

Conventional ROM devices employ the channel transistor as the basis for construction of the memory cell unit. Programming of the memory cell content is essentially a process that selectively implants impurities into the designated channel region for the alteration of the threshold voltage of the particular memory cell transistor. Depending on the status effected by the impurity implantation in the mask-programming procedure, the resulted ON or OFF state of the memory cell transistor when accessed can thus be translated into the binary memory content of the very memory cell unit.

Figure 1:
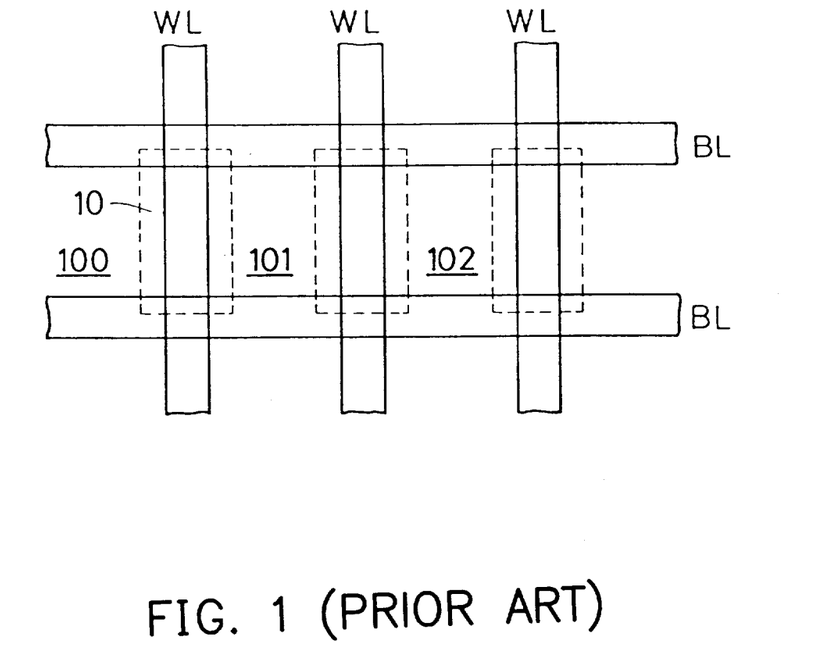
FIG. 1 is a top view schematically showing the layout of memory cell units of a typical ROM device.

FIG. 1 of the accompanying drawing of the invention is a top view that schematically depicts the layout of memory cell units of a typical ROM device. As is seen, three memory cell units generally identified by reference numerals 100, 101 and 102 are outlined in the drawing showing a portion of the memory cell array of the ROM device being examined. For the entire memory cell array, polysilicon word lines WL shown vertically in the drawing stride over the horizontal bit lines BL. Channel region 10 for one of the memory cell units 100 is seen identified by phantom line block. This channel region 10 for cell 100 is arranged in the location in the device substrate between two parallel bit lines and underneath the word line for the very memory cell unit. As mentioned above, one bit of binary information is stored in the form of impurity implantation status in this very channel region for the particular memory cell which, when accessed, can be interpreted as either binary "1" or "0."

Figure 2:
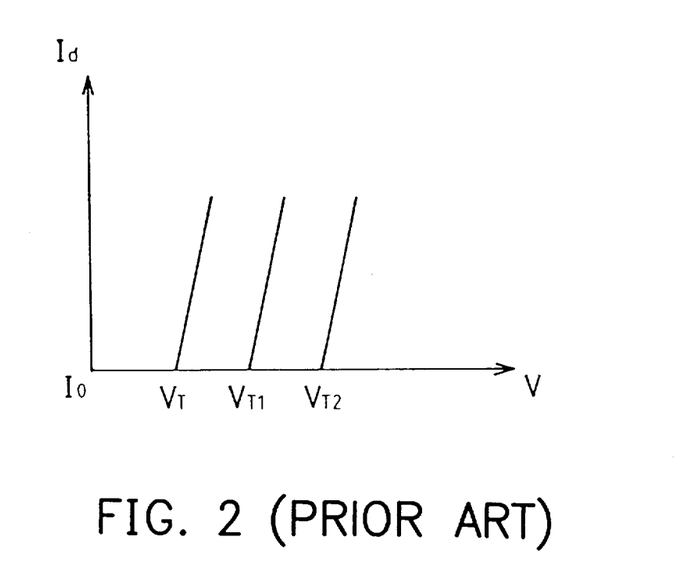
FIG. 2 is a voltage-current characteristic curve for the typical multi-stage memory cell units of a ROM device plotting the transistor threshold voltage against the drain current.

The above is a single-level memory device. By single-level it is meant that the electronic bits of information are stored as a single level above the zero, or ground state of the memory cell. In other words, ground and high level, a total of two voltage levels of signals picked up by the supporting circuitry of the memory cell array, comprise the essential two states for a binary information system. Efforts have been devoted to the development of multi-stage memory devices in which a memory cell unit is capable of holding an information unit that can be in one of more than two states. One such multistage memory cell concept employs the method of double-code implant to allow a memory cell in ROM device to be programmed into one of more than two electronic states. In essence, this is a scheme that allows a memory cell unit to be programmed into one of several states that, when accessed, turns out a corresponding one of several possible voltage signals such as voltages $V_T$, $V_{T1}$ and $V_{T2}$ outlined in the V-I diagram of FIG. 2. Each of these voltage levels can then represent a different memory content state that is one of several possible logical states for that particular memory cell.

Such a double-code implant method, however, made use the principle of controlling threshold voltage in the channel region of the memory cell unit that involves only limited differentiation between the achieved states. Such a conventional scheme of implementing multi-stage memory cell threshold voltages is not compatible with the trend of device miniaturization for fabricating ever larger capacity ROM memory devices.

SUMMARY OF THE INVENTION

It is therefore an object of the present invention to provide a multi-stage ROM semiconductor structural configuration and the method of its fabrication for implementing multi-stage memory cell transistor threshold voltages in limited memory cell surface area in the semiconductor substrate.

It is another object of the present invention to provide a multi-stage ROM semiconductor structural configuration and the method of its fabrication for implementing multi-stage memory cell transistor threshold voltages without involving sophisticated semiconductor device fabrication procedural steps.

The present invention achieves the above-identified objects by providing a process for fabricating multi-stage memory cell units of semiconductor ROM device. Each of the ROM device multi-stage memory cell units holds data bits that can be interpreted into any one of a number of voltage or current levels of more than two. The process comprises the steps first forming a MOS transistor in the device substrate, and the transistor comprises a pair of source/drain regions and a gate structure. An insulating layer is then formed covering the transistor. A contact opening is then formed in each of the pair of source/drain regions. A resistor connecting across the source/drain regions of the transistor is then formed, and the resistor has each of its ends extending into corresponding one of the contact openings. Then, the memory cell unit is programmed at a first stage by optionally cutting or not cutting the resistor into electrically disconnected halves. In the second stage of programming, impurity ions are optionally implanted into the channel region underneath the transistor gate structure with or without the presence of a masking layer covering the channel region. Combinations of different resistance values in the source/drain resistor and different transistor channel region threshold voltages obtained in the first and second programming stages therefore comprise the multi-stage memory cell transistor threshold voltages for the ROM device.

The present invention further achieves the above-identified objects by providing a multi-stage memory cell unit of semiconductor ROM device. The multi-stage memory cell unit holding data bits that can be accessed into any one of a number of voltage or current levels of more than two. The multi-stage memory cell unit comprises a metal-oxide semiconductor transistor formed in the semiconductor substrate of the memory device, and the transistor includes a pair of source/drain regions and a gate structure. The cell unit further comprises an insulating layer covering the transistor, and a resistor connecting across the source/drain regions of the transistor. The resistor has each of its ends extending into corresponding one of a contact opening formed in the insulating layer revealing the surface of the source/drain regions. The resistor in the cell unit can be optionally cut or not cut into electrically disconnected halves, and the channel regions of the transistor directly underneath the gate structure being optionally implanted by impurity ions of different concentrations. The combinations of different resistance values in the source/drain resistor and different transistor channel region threshold voltages together comprise the multi-stage memory cell transistor threshold voltages for the ROM device.

BRIEF DESCRIPTION OF THE DRAWING

Other objects, features, and advantages of the present invention will become apparent by way of the following detailed description of the preferred but non-limiting embodiments. The description is made with reference to the accompanied drawings in which.

DETAILED DESCRIPTION OF THE PREFERRED EMBODIMENT

Refer to FIGS. 3A–3G of the drawing for the description of a preferred embodiment of the present invention. FIGS. 3A–3G are cross-sectional views respectively showing the process stages in which a fabrication of the metal-oxide semiconductor (MOS) transistor memory cell unit of the invention is depicted.

Figure 3A:
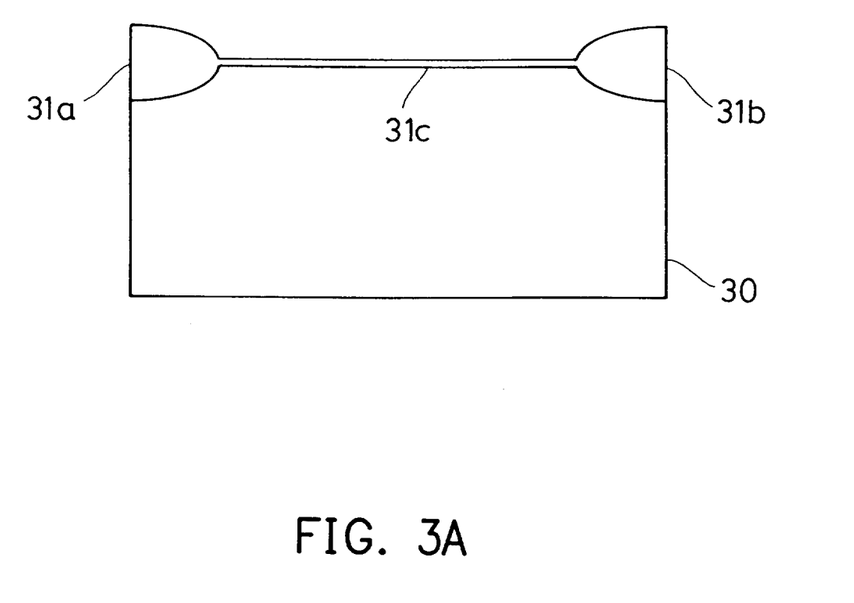
FIG. 3A–3G are respectively cross-sectional views depicting the process stages of fabrication of the basic multi-stage memory cell units for a ROM device in accordance with a preferred embodiment of the invention.

First, as is shown in FIG. 3A, an active area is defined in the designated location of the semiconductor substrate 30 used for fabricating the memory device. A LOCOS (local oxidation of silicon) procedure is then employed to form the field oxide layers 31a and 31b, followed by the implementation of an ion implantation procedure in order to form a region of the transistor that allows the transistor to have the desired threshold voltage. A gate oxide layer 31c is then formed over the surface of the device substrate 30.

Figure 3B:
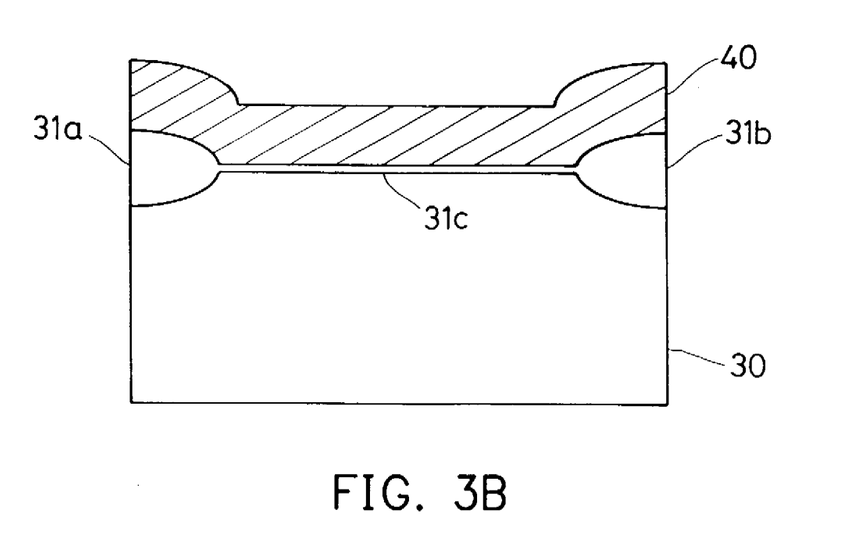
Figure 3C:
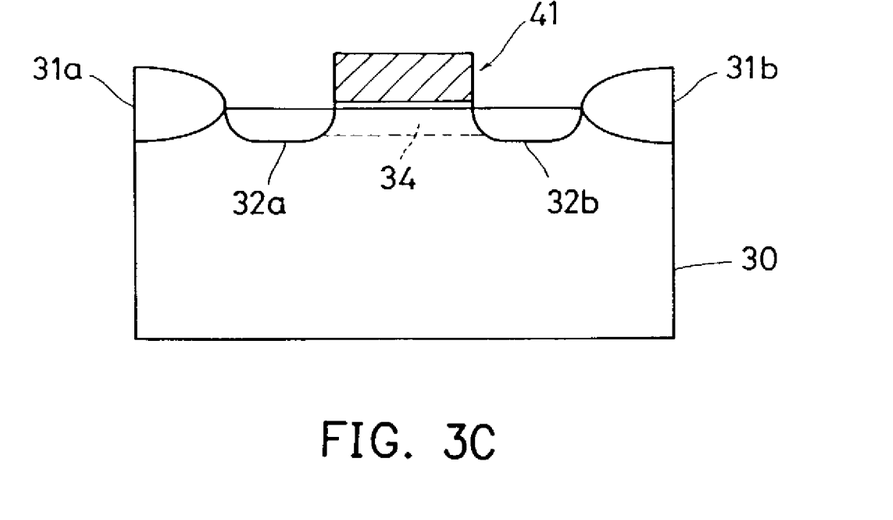

Then, as shown in FIG. 3B, an electrically conductive layer such as a polysilicon layer 40 is formed by deposition over the surface of the device substrate 30. Photolithographic and etching procedures are then used to properly define the necessary patterning as shown in FIG. 3C so as to form the gate structure 41 for the cell unit transistor. With the presence of the gate structure 41, and the field oxide layers 31a and 31b, which together serve as the mask for the implementation of an ion implantation procedure, source/drain regions 32a and 32b are formed in the substrate 30 between the gate structure 41 and the field oxide layers 31a and 31b, as is seen in the cross-sectional view of FIG. 3C.

Thus, as is shown in FIG. 3C, gate structure 41, along with the source/drain regions 32a and 32b, constitute a MOS transistor having a channel region 34 generally identified by phantom line in the drawing that is directly underneath gate 41. In the described embodiment of the invention, source/drain regions 32a and 32b comprise the bit line and gate 41 comprises the word line for the particular transistor memory cell unit of the fabricated ROM device.

Figure 3D:
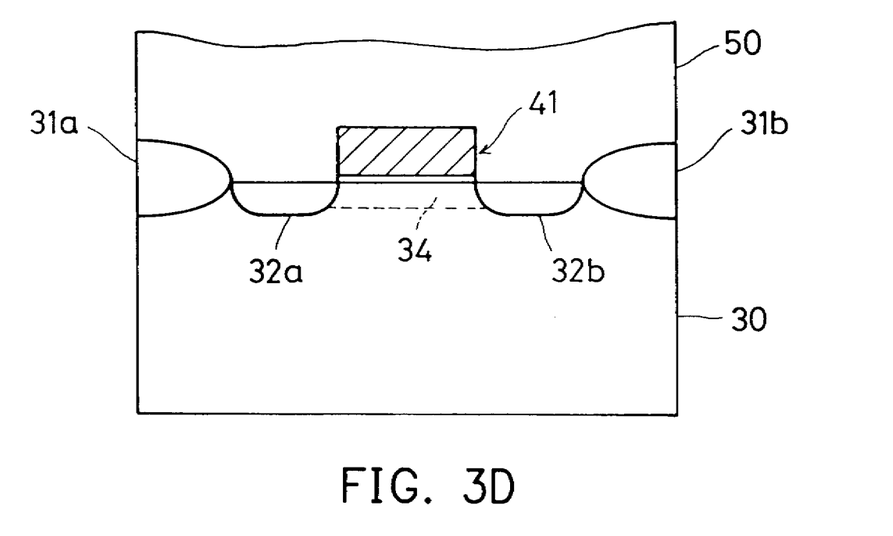
Figure 3E:
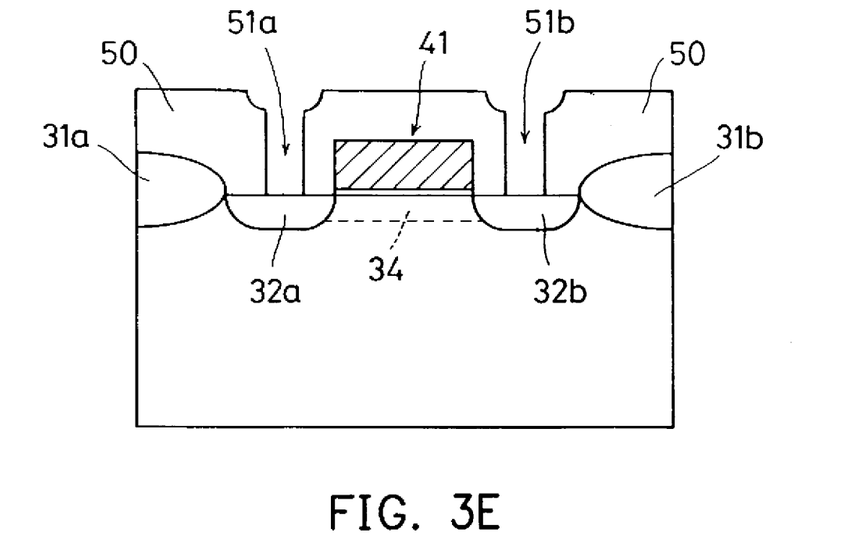

Then, as is shown in FIG. 3D, an electrically insulating layer 50, for example, a BPSG (borophosilicate glass) layer formed in a CVD (chemical vapor deposition) procedure, is formed over the surface of the shaped MOS transistor element. The deposited insulating layer 50 is then planarized in order to allow for the formation of the contact openings in the fabricated device. As is shown in FIG. 3E, contact openings 51a and 51b may thus be formed in designated locations of the device that reveal the corresponding surface of the source/drain regions 32a and 32b respectively. These contact openings 51a and 51b can be formed in a photolithographic procedure that defines the patterning of the openings in the insulation layer 50 and followed by the implementation of an etching procedure that actually shapes the openings.

Figure 3F:
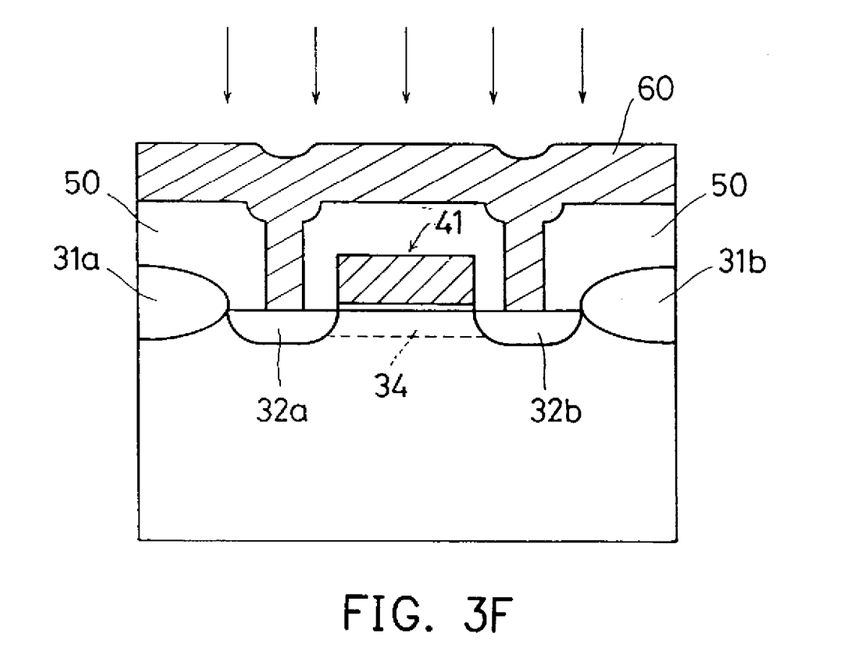

Next, as is shown in FIG. 3F, a TFT (thin-film transistor) active layer deposition or a polysilicon deposition procedure may then be employed to form an electrically resistive layer 60 over the surface of the fabricated device. Resistance in the formed layer 60 may be adjusted by way of ion implantation in the layer. Photolithographic and etching procedural steps then follow to shape the resistive layer 60 into a desired resistor element having a selected configuration as depicted in drawing FIG. 3G. Assuming the resistor 60 has a resistance of R1, which allows the fabricated MOS transistor to exhibit a corresponding threshold voltage of $V_{T1}$.

Figure 3G:
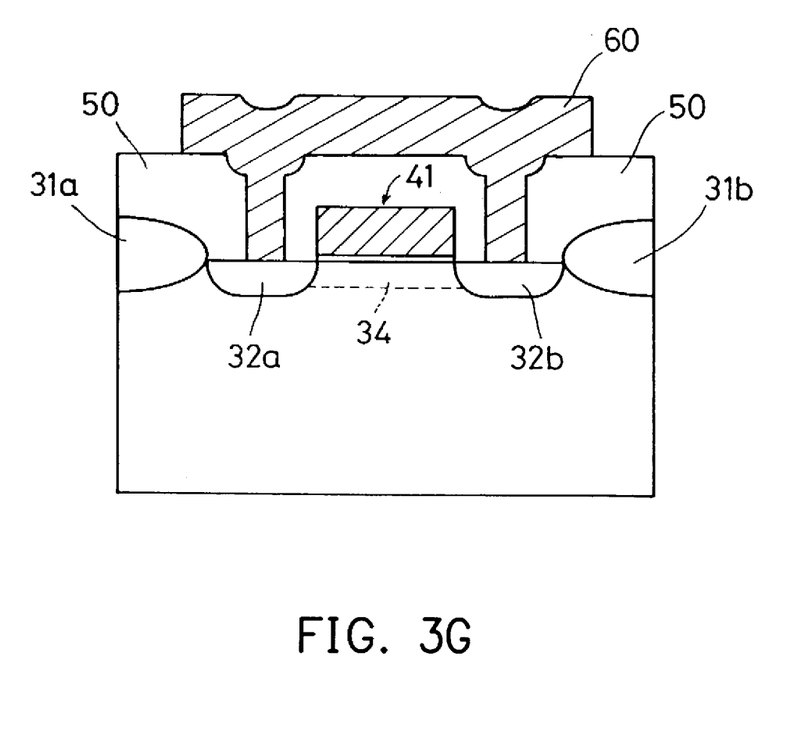

With each of the memory cell units constructed around the MOS transistor element such as described above and shown in the cross-sectional view of FIG. 3G, it is possible to implement a multi-stage ROM memory device, further explained in the following paragraphs. Refer to FIGS. 4A–4E for a description for an implementation of multi-stage ROM memory device based on the double-code implanting scheme.

Figure 4A:
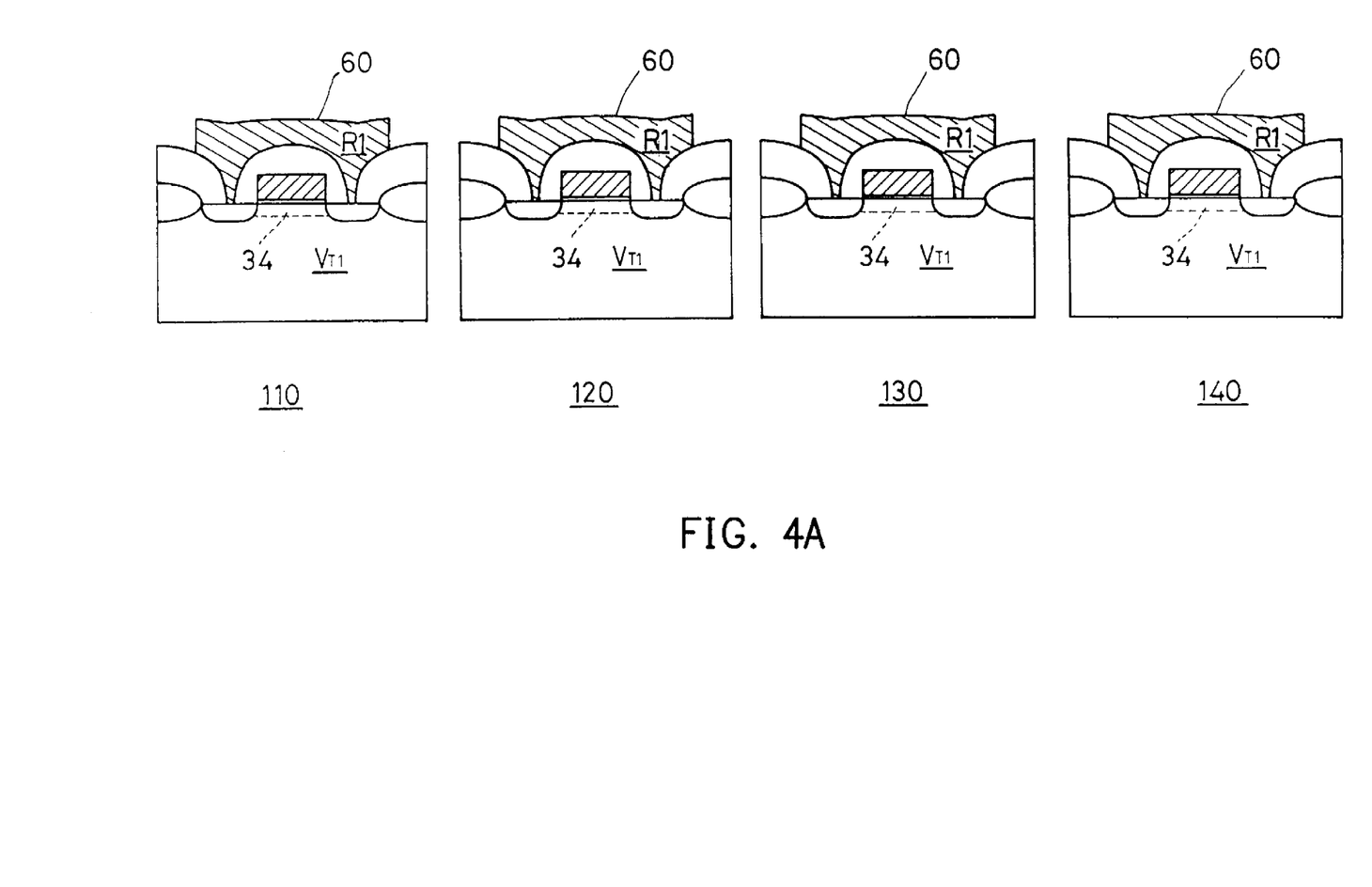
FIG. 4A–4E are respectively cross-sectional views depicting the process stages of the memory content programming of multi-stage memory cell unit for a ROM device in accordance with the preferred embodiment of the invention.

As is shown in FIG. 4A, four basic ROM device memory cell units to be programmed to each holds one of four possible multi-stages that corresponds to one of four possible logical states are identified by reference numerals 110, 120, 130 and 140 respectively. In other words, each of the memory cell units 110, 120, 130 and 140 is required to be programmed to hold one bit of data that can be distinguished as a different bit of information in a four-state logical numbering system. Assuming, as described above, each of the memory cell transistors has a resistor with a resistance R1 connected between the source/drain regions thereof, and exhibiting a transistor threshold voltage of $V_{T1}$.

Figure 4B:
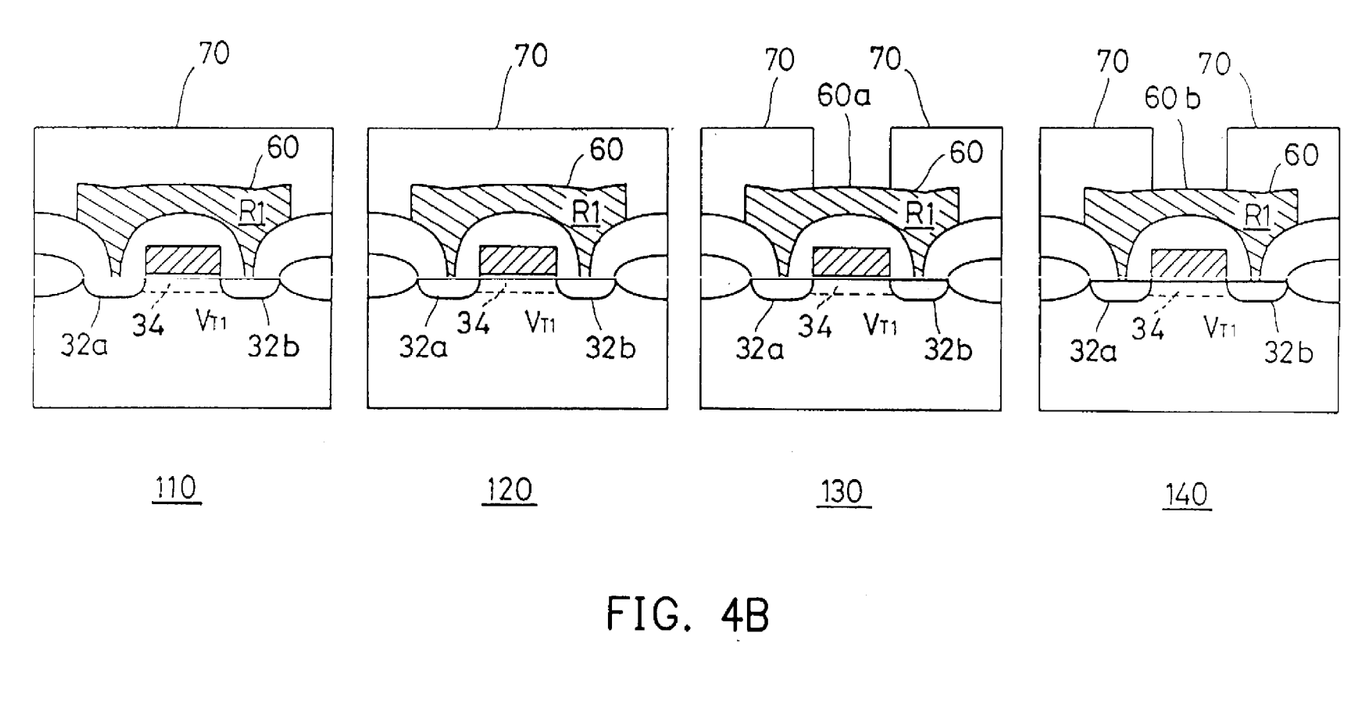
Figure 4C:
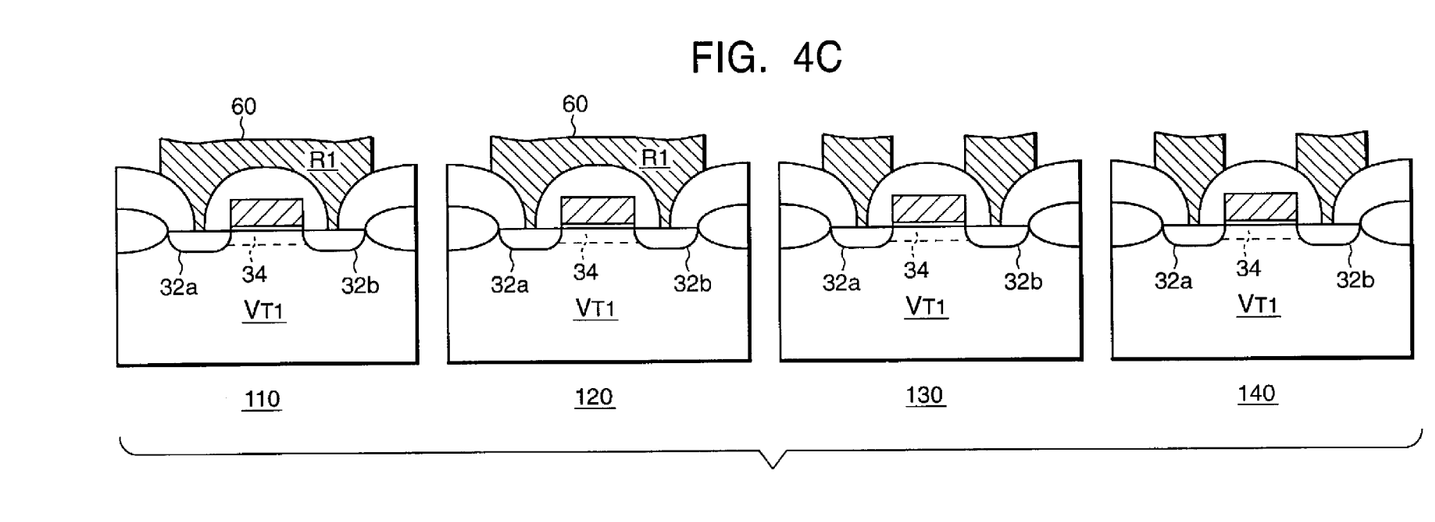

First, in FIG. 4A, each of the four memory cell units has the transistor element thereof generally covered by a photoresist layer 70. Then, as is seen in FIG. 4B, a first of the double coding scheme may be implemented by disabling the effectiveness of the source/drain resistors 60 of the third and fourth transistor elements 130 and 140 as is seen in the drawing. This can be achieved by properly patterning in the photoresist layer 70 to form openings 60a and 60b therein. As is seen in the drawing, openings 60a and 60b each reveals a central section of the top surface of the resistor 60 covered by the photoresist layer 70. Essentially, openings 60a and 60b is aligned with the gate 41 of the transistor elements 130 and 140. An etching procedure may then be implemented to etch into the exposed section of the resistors 60 in transistor cell units 130 and 140, and substantially cuts the resistors 60 into electrically isolated halves as is shown in the cross-sectional view of FIG. 4C. At this stage, resistors 60 in memory cell units 110 and 120 retain their original resistance of R1, while in memory cell units 130 and 140, the resistance is effectively infinitely large. However, all four units 110, 120, 130 and 140 retain the transistor threshold voltage of $V_{T1}$.

Figure 4D:
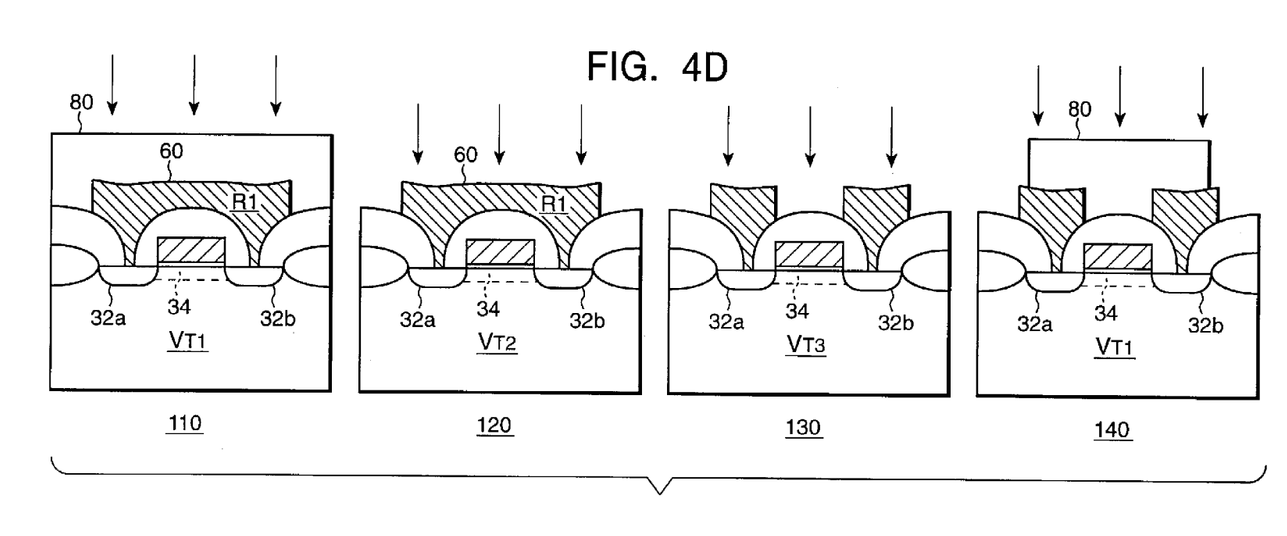

Next, second of the double-coding scheme can be implemented as is described in the following paragraphs with reference to FIGS. 4D and 4E. As is seen in FIG. 4D, first and fourth memory cell units 110 and 140 are now covered by another photoresist layer 80, while the second and third ones 120 and 130 remain uncovered. An ion implantation procedure then follows to implant ions into the channel regions of the second and third units 120 and 130 respectively. Due to the presence of the photoresist layers 80 in the first and fourth units 110 and 140, the two units are virtually not implanted in the procedure. The voltage threshold in their respective transistors remain virtually unaltered as $V_{T1}$.

On the other hand, since channel regions 34 in the second and third memory cell units have been subjected to ion implantation of different ion concentration due to the presence and non-presence of the resistor section above the gate 41 of the transistor element, different transistor threshold voltages may thus result for units 120 and 130 respectively.

Figure 4E:
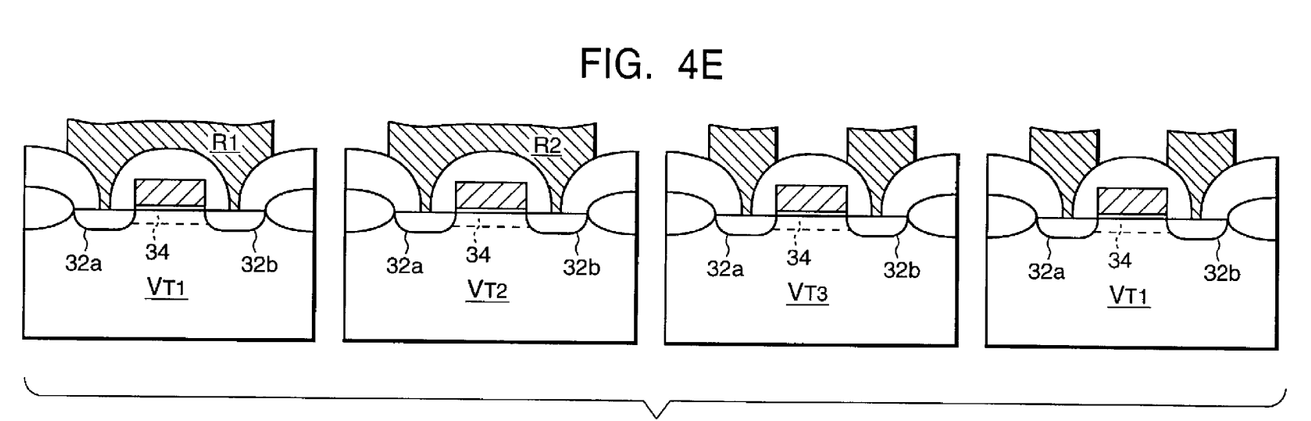
Figure 5A:
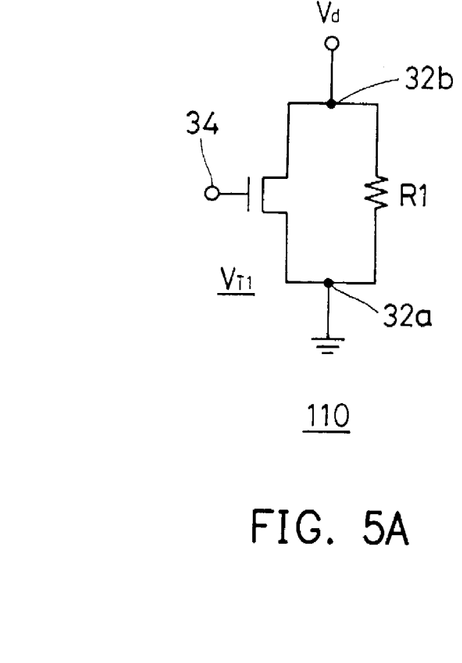
FIGS. 5A–5D respectively show the equivalent circuits for the four different memory cell units of FIGS. 4A–4E.
Figure 5B:
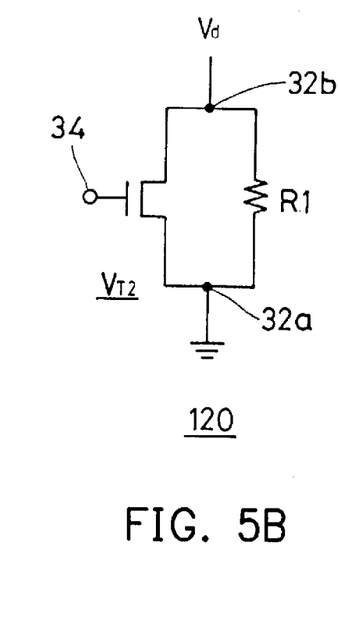
Figure 5C:
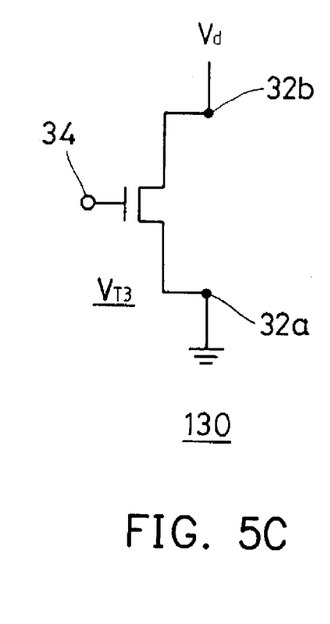
Figure 5D:
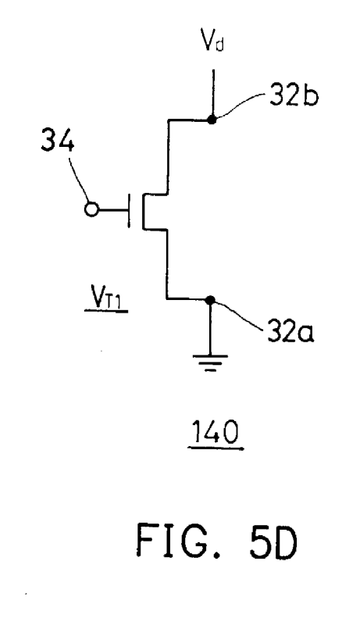

Thus, after the removal of the photoresist layer 80 as is shown in FIG. 4E, each of the four memory cell units 110, 120, 130 and 140 may now have different effective memory cell unit transistor threshold voltage values based on the different source/drain resistor values and different channel region threshold voltages. Specifically, units 110, 120, 130 and 140 have a resistance-threshold combination of (R1, $V_{T1}$), (R1, $V_{T2}$), (, $V_{T3}$) and (, $V_{T1}$) respectively, which can be equivalent to a group of four effective memory cell unit threshold voltages that are different from one another. This can be further explain with reference to FIGS. 5A–5D of the drawing.

FIGS. 5A–5D respectively show the equivalent circuit for the four different memory cell units of FIGS. 4A–4E. As is outlined in the equivalent circuit diagrams, the four memory cell units 110, 120, 130 and 140 have the parallel circuit connection of the memory cell unit transistor and the resistor connected across the transistor source/drain regions. Effective memory cell transistor threshold voltage for the four different configurations may thus be different from each other, and can be used to distinguish between the four different logical states of a four-state numbering system.

Figure 6:
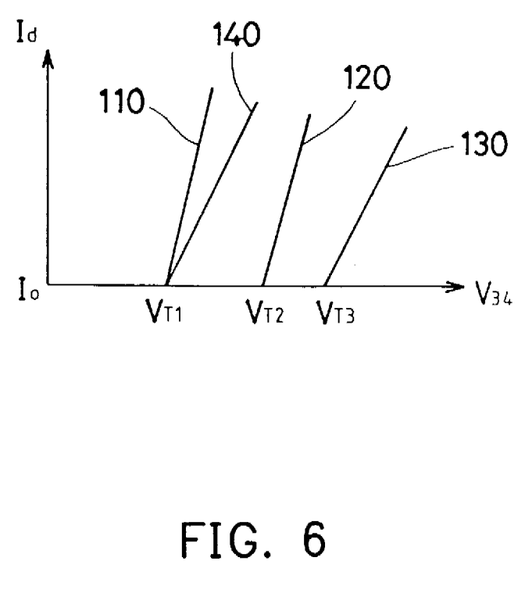
FIG. 6 depicts the V-I characteristics of the four memory cell units fabricated in accordance with the preferred embodiment of the invention.

FIG. 6 depicts the V-I characteristics of the four memory cell units thus fabricated in accordance with the described process embodiment of the invention as outlined in FIGS. 3A–3G and FIGS. 4A–4E. These characteristic curves are plotted for the transistor drain current Id against the gate voltage $V_{34}$. As is outlined in the V-I characteristics of FIG. 6, each of the four memory cell units are represented by a different characteristics curve correspondingly identified by reference numerals 110, 120, 130 and 140. This allows for the distinction between the four data bits held in the correspondingly programmed memory cell units when proper supporting logic circuits are used to access the memory cell units.

Thus, while the invention has been described by way of examples and in terms of the preferred embodiment, it is to be understood that the invention is not necessarily limited thereto. On the contrary, it is intended to cover the various modifications as well as similar arrangements included within the spirit and scope of the appended claims. Scope of the appended claims should be accorded the broadest possible interpretation so as to encompass all such modifications and similar structures.

What is claimed is:

1. A process for fabricating multi-stage memory cell unit of semiconductor read-only memory device, said multi-stage memory cell unit holding data bits that can be accessed into any one of a plurality of voltage or current levels, said process comprising the steps of (a) forming a metal-oxide semiconductor transistor in the semiconductor substrate of said memory device, said transistor comprising a pair of source/drain regions and a gate structure;

(b) forming an insulating layer covering said transistor;

(c) forming a contact opening in each of said pair of source/drain regions;

(d) forming a resistor connecting across said source/drain regions of said transistor, said resistor having each of the ends thereof extending into corresponding one of said contact openings;

(e) programming said memory cell unit at a first stage by optionally cutting or not cutting said resistor across said source/drain regions into electrically disconnected halves; and (f) programming said memory cell unit at a second stage by optionally implanting impurity ions into the channel region underneath said transistor gate structure with or without the presence of a masking layer covering said channel region;

wherein combinations of different resistance values in said source/drain resistor and different transistor channel region threshold voltages obtained in said first and second programming stages comprise the multi-stage memory cell transistor threshold voltages for said READ-ONLY MEMORY device.

2. The process of claim 1, wherein said step (b) comprises forming a borophosilicate glass layer in a chemical vapor deposition procedure.

3. The process of claim 1, wherein said step (d) comprises forming a resistor in a thin-film transistor active layer deposition procedure.

4. The process of claim 1, wherein said step (d) comprises forming a resistor by depositing a polysilicon layer.

5. The process of claim 1, wherein said step (e) comprises optionally cutting said resistor into two electrically disconnected halves in a photolithographic and etching procedure.

6. The process of claim 1, wherein said step (f) comprises optionally implanting impurity ions into said channel region underneath said transistor gate structure with the presence of a photoresist masking layer covering said channel region.

* * * * *